United States Patent
Alexander et al.

(10) Patent No.: US 7,810,055 B1
(45) Date of Patent: Oct. 5, 2010

(54) DESIGN INDEPENDENT CORRELATION DATA STORAGE FOR USE WITH PHYSICAL DESIGN OF PROGRAMMABLE LOGIC DEVICES

(75) Inventors: Brian J. Alexander, Erie, CO (US); Jaime D. Lujan, Louisville, CO (US); W. Story Leavesley, III, Longmont, CO (US)

(73) Assignee: Xilinx, Inc., San Jose, CA (US)

( * ) Notice: Subject to any disclaimer, the term of this patent is extended or adjusted under 35 U.S.C. 154(b) by 973 days.

(21) Appl. No.: 11/633,962

(22) Filed: Dec. 5, 2006

(51) Int. Cl.
*G06F 17/50* (2006.01)

(52) U.S. Cl. .................................. 716/3; 716/4; 716/17

(58) Field of Classification Search ........................ None
See application file for complete search history.

(56) References Cited

U.S. PATENT DOCUMENTS

| | | | |
|---|---|---|---|
| 6,735,593 B1 * | 5/2004 | Williams | 1/1 |
| 6,817,000 B2 * | 11/2004 | Rich et al. | 716/6 |
| 7,085,701 B2 * | 8/2006 | Rich et al. | 703/14 |
| 7,181,715 B2 * | 2/2007 | Sato et al. | 716/11 |
| 7,194,400 B2 * | 3/2007 | Gabele et al. | 703/21 |
| 7,203,633 B2 * | 4/2007 | Gabele et al. | 703/15 |
| 7,237,214 B1 * | 6/2007 | Pandey et al. | 716/7 |
| 7,373,290 B2 * | 5/2008 | Gabele et al. | 703/21 |
| 7,480,608 B2 * | 1/2009 | Gabele et al. | 703/21 |
| 7,493,578 B1 * | 2/2009 | Milne et al. | 716/5 |
| 7,610,329 B2 * | 10/2009 | Bone et al. | 709/201 |
| 2003/0191618 A1 * | 10/2003 | Gabele et al. | 703/13 |

* cited by examiner

*Primary Examiner*—Leigh Marie Garbowski
(74) *Attorney, Agent, or Firm*—Kevin T. Cuenot; Lois D. Cartier (57) ABSTRACT

A method of managing correlation data for a design implementation process can include identifying correlation data from each of a plurality of design applications. Each of the design applications can generate a circuit description and the correlation data can specify associations between circuit elements of different ones of the circuit descriptions. The method also can include storing the circuit descriptions and the correlation data independently of one another and determining a relationship among circuit elements of the circuit descriptions according to the correlation data.

17 Claims, 4 Drawing Sheets

DESIGN INDEPENDENT CORRELATION DATA STORAGE FOR USE WITH PHYSICAL DESIGN OF PROGRAMMABLE LOGIC DEVICES

FIELD OF THE INVENTION

This invention relates to the field of electronic circuit design and, more particularly, to managing correlation data generated during the physical implementation of a circuit design for a target device.

BACKGROUND

Circuit designs, or circuit descriptions, are frequently specified using any of a variety of different software-based formats. For example, circuit descriptions can be specified using a hardware description language, such as VHDL or Verilog, or, in some cases, using a general-purpose, high-level programming language such as C++. Despite the particular manner in which a circuit design is specified, a user-created circuit description must undergo a significant amount of processing to generate a version of the circuit design that can be used to program a target device, i.e., a bitstream.

To physically implement a circuit design within a programmable logic device, such as a field programmable gate array (FPGA), for example, the circuit design must undergo various stages of processing such as synthesis, mapping, packing, etc. Each stage is typically performed by a design application, which may be included as part of an electronic design automation (EDA) system. The design applications usually operate sequentially, with each design application producing a different circuit description as output to be provided to the next design application, or stage, as input. For example, with respect to an FPGA, a user can first create a logical circuit description using an HDL. The logical circuit description is read by the design applications, with each design application transforming the circuit topology, connectivity, logical functions, etc. Each of the design applications creates a new circuit description that is saved to a file for use by the next design application in the implementation process.

Each of the circuit descriptions specifies circuit elements such as logic blocks, signals, pins, networks, etc. These circuit elements are modified or transformed as each application operates to produce a new circuit description output. The implementation process generates a series of independent circuit descriptions, with each circuit description reflecting the state of the circuit design in a different stage of the implementation process. The final processing stage produces a circuit description that specifies a set of building blocks, specific to the target device, which can be used to program the target device.

Another product of the implementation process that is generated by the design applications is correlation data. In general, correlation data specifies the transformations that are applied to the various circuit elements from one circuit description to the next. The correlation data effectively allows the design applications to determine associations between a given circuit element in one circuit description with circuit elements in one or more other circuit descriptions. That is, the correlation data indicates that a given circuit element, or set of elements, in one circuit description has been transformed into another element, or set of elements, or removed altogether, in another circuit description. For example, correlation data can indicate the particular logic gate circuit elements from one circuit description that have been combined into a particular Look-Up Table (LUT) circuit element in another circuit description.

The final circuit description can be analyzed to characterize the behavior of the circuit design. For example, reports can be created that provide the circuit designer with information about the validity and timing characteristics of an FPGA implementation. For this information to make sense to the circuit designer, the information must be presented in terms of the original user-specified circuit description, as it existed prior to any design implementation transformations. Correlation data permits analysis information corresponding to circuit elements of the final circuit description to be related to circuit elements of the user-specified circuit description, or any intermediate circuit description for that matter.

Correlation data also permits a user to specify implementation constraints at any time within the design implementation process. The implementation constraints can be specified with respect to the circuit elements of the user-specified circuit description. The correlation data can be used to apply, or map, those constraints to the proper circuit elements in the resulting circuit description or other intermediate circuit descriptions.

In known processes, correlation data is added to the circuit elements themselves, i.e., directly to the objects representing the circuit elements within each respective circuit description. Because correlation data is co-mingled with multiple circuit descriptions, determining relations between circuit elements of different circuit descriptions (for example, to track the transformation of a circuit element or group of circuit elements) can consume a significant amount of computing resources. In illustration, when correlation data is queried, an entire circuit description and accompanying correlation data is loaded into memory. A search is conducted within the circuit description to locate the desired circuit elements. The correlation data for those elements is accessed to identify any corresponding circuit elements in other circuit descriptions. Those circuit descriptions then can be loaded into memory and searched in an effort to locate further correlation data. The process continues to iterate until the query terminates. In view of the significant size of circuit descriptions and the need to load multiple circuit descriptions when executing a query, it can be seen that querying correlation data can be costly in terms of both time and system memory.

In addition to the high cost of searching correlation data, another disadvantage of co-mingling correlation data with circuit description data is that the likelihood of a design application corrupting a circuit element while trying to access correlation data is heightened. Any design application that works with the circuit description must be aware of the placement of the correlation data within the circuit description and take care not to delete, modify, or otherwise corrupt the correlation data or the circuit element objects.

The manner in which correlation data is maintained has been a disincentive to further development of design implementation functions that rely on correlation data. In light of the computational cost, many potential correlation functions are not implemented at all. It would be beneficial to provide a technique for managing correlation data for circuit design implementation in a manner that addresses the deficiencies described above.

SUMMARY

The present invention provides method(s) and articles of manufacture relating to the generation, storage, and management of correlation data that is created during a circuit design implementation process. One embodiment of the present invention can include a method of managing correlation data for a circuit design implementation process. The method can include identifying correlation data from each of a plurality of design applications. Each of the design applications can generate a circuit description and the correlation data can specify associations between circuit elements of different ones of the circuit descriptions. The method also can include storing the circuit descriptions and the correlation data independently of one another and determining a relationship among circuit elements of the circuit descriptions according to the correlation data.

Correlation data for each circuit description can be stored within a different circuit-level container of a persistent correlation data store. Storing also can include creating, within each circuit-level container, a hierarchy of containers. The hierarchy can be determined according to a hierarchy of the circuit description corresponding to each respective circuit-level container. The storing of correlation data can include defining explicit relationships within the correlation data, wherein each explicit relationship specifies at least one of a source correlated item or a destination correlated item.

At least one implicit relationship can be defined between two different containers of correlation information. The method also can include selectively imposing an implicit relationship between at least one correlated item in a first container and at least one correlated item in a second container. If a plurality of implicit relationships are defined between two containers, the method can include determining an order in which the plurality of implicit relationships are selectively imposed upon the correlation data in the two containers.

The method also can include applying an implicit relationship in response to a query of the correlation data and creating at least one temporary correlated item within a container referenced by the implicit relationship. The method can include returning the at least one temporary correlated item in response to the query.

In another embodiment, metadata relating to a transformation of a selected circuit element in one of the circuit descriptions into a circuit element of another circuit description can be stored as part of the correlation data.

Another embodiment of the present invention can include a system for managing correlation data generated during implementation of a circuit design for a programmable logic device. The system can include a circuit description data store having a plurality of circuit descriptions generated during a circuit design implementation process and a correlation data store having correlated items corresponding to selected circuit elements from the plurality of circuit descriptions. The correlation data also can include explicit relationships specifying relationships between the correlated items. The correlation data is not commingled with the circuit descriptions.

The system also can include a correlation manager configured to query the correlation data and identify relationships among correlated items. A correlation helper can be included that is configured to map correlated items to circuit elements from the circuit description data store.

The correlation data store can be organized into a plurality of different containers, wherein each container can include correlation data for a specific circuit description. Each container corresponding to a specific circuit description can be organized into a hierarchy of containers. The hierarchy can be determined according to a hierarchy of the circuit description corresponding to that container. The correlation manager can selectively apply at least one implicit relationship between at least one correlated item in a first container and at least one correlated item in a second container.

Yet another embodiment of the present invention can include a machine readable storage medium, having stored thereon a computer program having a plurality of code sections for causing a machine to perform the various steps and functions described herein.

BRIEF DESCRIPTION OF THE DRAWINGS

Presently preferred embodiments are shown in the drawings. It should be appreciated, however, that the invention is not limited to the precise arrangements and instrumentalities shown.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of the invention.

The embodiments disclosed herein relate to managing correlation data generated during design implementation of a circuit design for a given target device. Correlation data generated during different stages of design implementation of a circuit design can be stored independently of the circuit descriptions that also are generated. By storing correlation data separately, the amount of memory required to implement functions and/or features involving the correlation data can be significantly reduced. Such is the case in the disclosed embodiments, as circuit descriptions need not be loaded into memory to access the correlation data. Similarly, functions that use only circuit description data do not need to incur the overhead of loading a circuit description that includes correlation data.

Correlation data independence allows the correlation data to be accessed and searched more quickly and facilitates the storage of additional metadata. This metadata can be generated concurrently with the correlation data or can be appended to the correlation data at various points in time, e.g., at different stages of design implementation or at some point following the process. The metadata further can be accessed by other design applications for a variety of purposes. The storage of correlation data using a separate storage mechanism than is used for circuit description data also allows each data store, or type of data, to be optimized independently depending upon the different needs of the users of the data.

Figure 1:
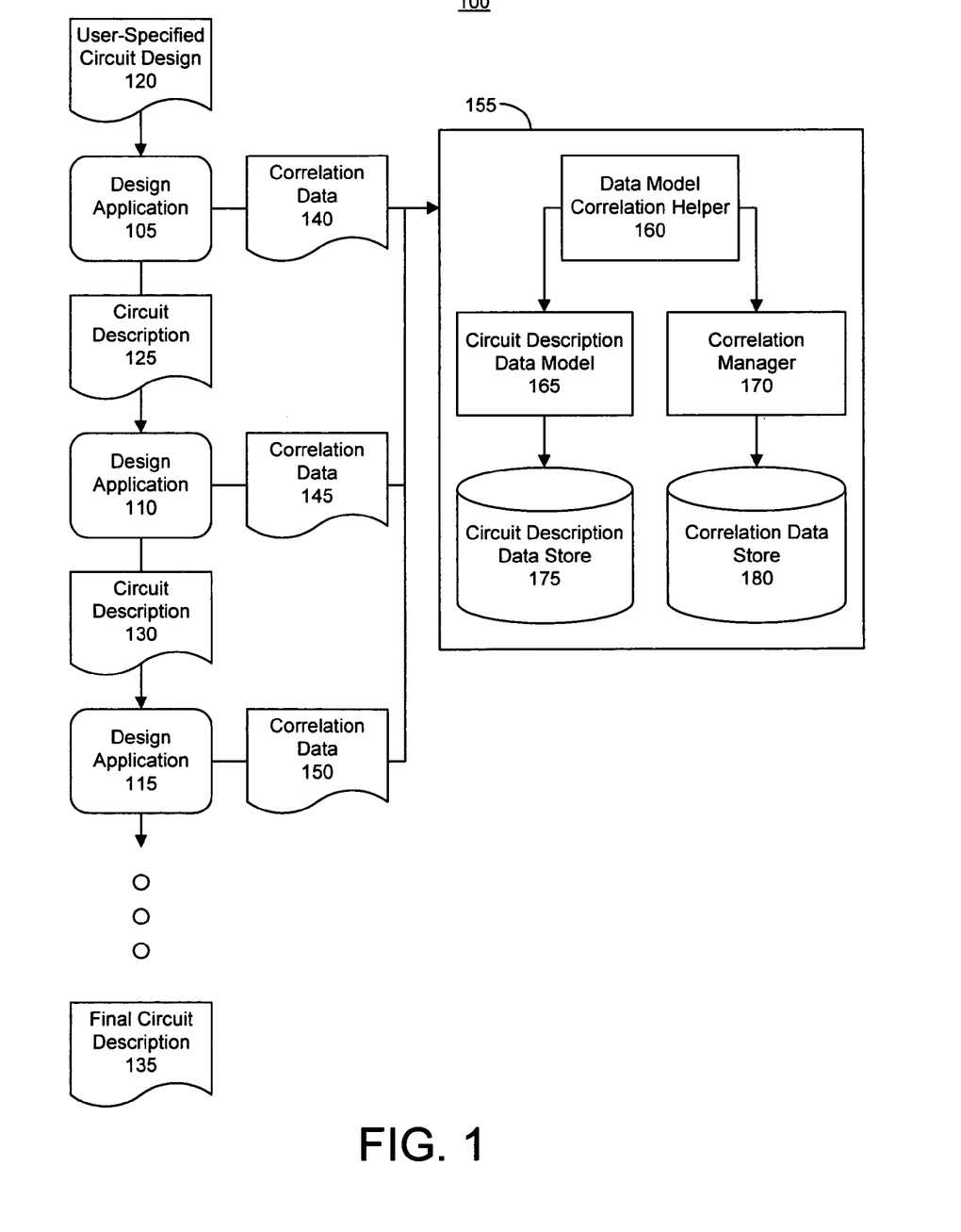
FIG. 1 is a block diagram illustrating a system for maintaining correlation data in accordance with one embodiment of the present invention.

FIG. 1 is a block diagram illustrating a system 100 for maintaining correlation data in accordance with one embodiment of the present invention. The system 100 can store and manage correlation data generated by one or more different design applications 105, 110, and 115. Each of the design applications 105-115 can perform a given function including, but not limited to, synthesis, mapping, packing, or any other function needed to transform and/or optimize a user-specified circuit description into a format, i.e. another circuit description, that can be used to program a target device.

As shown, each of the design applications 105-115 can operate in sequential fashion, with one design application receiving the output of a prior design application as input. Thus, a user-specified circuit design 120 can be provided to the first design application 105, which operates on, e.g., synthesizes, the user-specified circuit design 120 to produce another circuit description 125. Any transformations applied to the various circuit elements, such as logic blocks, signals, pins, and networks, of the user-specified circuit design 120 to form circuit elements of the circuit description 125 can be specified within the correlation data 140 that is generated by the design application 105.

Similarly, the circuit description 125 can be provided to the design application 110 to operate on, e.g., map, circuit description 125 to produce circuit description 130. Any transformations applied to the circuit elements of circuit description 125 to generate circuit description 130 can be specified within the correlation data 145. Design application 115 can operate on, e.g., pack, circuit description 130 to produce a circuit description, which may or may not undergo further processing by other design applications before the final circuit description 135 is generated. As noted, the final circuit description 135 can be used to configure or program a target device, whether a programmable logic device such as a field programmable gate array or an application specific integrated circuit. Transformations applied to the circuit description 130 by the design application 115 can be specified within the correlation data 150.

The correlation management system 155 can maintain and/or manage the correlation data 140, 145, and 150 as well as circuit descriptions 120, 125, 130, and 135. The correlation management system 155 can include a data model correlation helper 160, a circuit description data model 165, a correlation manager 170, a circuit description data store 175, and a correlation data store 180. The correlation management system 155 can maintain circuit description data independently from correlation data, which describes the various transformations that have been applied to the different circuit descriptions 120-135 and which further can include metadata.

Metadata can be stored as part of the correlation data. While correlation data describes relations between items, metadata can describe the algorithmic data detailing how a relationship came to be, e.g., various measures of correlation. In one embodiment, metadata can specify attributes that provide a measure of effectiveness of a given transformation. For example, a design application can perform a transformation of one or more circuit elements. During or after the transformation, the design application can assess the successfulness of the transformation by evaluating one or more metrics. Based upon the values of the metrics, a measure of effectiveness can be assigned and stored as metadata. This measure can be available to other software tools, including the design applications, for use in making implementation decisions. In another example, if the circuit design is reprocessed by the design application that formulated the measure of effectiveness, that design application can access the measure and selectively apply an alternative transformation if the measure of effectiveness is below a threshold value.

In another embodiment, metadata can include one or more parameters that indicate reasons a given transformation was utilized. For example, metadata can indicate that a transformation was applied to better conform to user-specified constraints. In another example, the metadata can indicate the results of a time consuming analysis of the circuit design. This would allow future implementations to determine whether the constraints and/or reasons specified in the metadata are still applicable and should be used again.

The various circuit descriptions 120-135, can be stored and maintained within the circuit description data store 175. The circuit description data store 175 can be a persistent data store, e.g., a disk drive, array, server, or the like. The circuit description data model 165 can provide the functions necessary for storing, retrieving, and reading the circuit descriptions, including individual circuit elements such as logic blocks, signals, pins, and networks as may be represented by circuit design objects stored within the circuit description data store 175.

The correlation data 140, 145, and 150 are stored and maintained within the correlation data store 180, which also can be implemented as a persistent data storage mechanism. In one embodiment, the correlation data store 180 can include a database in which the correlation data 140, 145, and 150 can be stored. In another embodiment, the correlation data 140, 145, and 150 can be collected and stored as one or more flat files. Despite the particular data structure used, the various portions of correlation data generated from each respective design application 105-115, e.g., correlation data 140, 145, and 150, can each be stored within a separate container in the correlation data store 180. Storing the various portions of correlation data in different containers aids in defining relationships among various circuit elements from one circuit description to the next.

The correlation manager 170 provides services for storing and reading correlation data from the correlation data store 180. In one embodiment, the correlation manager 170 can be implemented as part of a database layer of which the correlation data store 180 also is part. As shown, the correlation manager 170 is independent of the mechanisms for storing and accessing the circuit description data store 175. The correlation manager 170 provides functions which allow the loading of small portions of correlation information, e.g., only those portions necessary for executing a given correlation data query. Thus, circuit descriptions from the circuit description data store 175 need not be loaded into memory to query the correlation data stored in the correlation data store 180.

The data model correlation helper 160 also can be implemented within the database layer. The data model correlation helper 160 can provide mapping functions for any clients seeking correlation information for objects of the circuit descriptions stored within the circuit design data store 175. While the correlation data specifies relations between circuit elements from one circuit description to the next, if more detailed information is needed regarding a specific circuit element, e.g., information beyond the particular name of the circuit element, that data must be obtained from the circuit description data store 175. The data model correlation helper 160 can match correlation data with the corresponding circuit elements, e.g., map the correlation data to such circuit elements, by accessing the functions provided by the circuit description data model 165. That is, based upon a set of correlation information, the data model correlation helper 160 can initiate a query of the circuit description data via the circuit description data model 165 to identify the actual circuit element objects from which additional information can be obtained.

In operation, design applications 105-115 can interact with either the data model correlation helper 160 or directly with the correlation manager 170 to store, retrieve, or otherwise access correlation data within the correlation data store 180. The data model correlation helper 160, for example, can provide an abstraction layer through which various applications may communicate rather than with the correlation manager 170. This allows clients to specify queries in terms of user-specified circuit elements without concern for transformations that have occurred and without having to express the queries in terms of correlation data.

Various client applications can query the correlation data stored within the correlation data store 180 via the correlation manager 170 and/or the data model correlation helper 160. Thus, on behalf of a client application, the correlation manager 170 can query the correlation data. Results can be passed to the data model correlation helper 160. The data model correlation helper 160 can relate the query results to the actual circuit elements specified as part of the circuit descriptions by submitting queries to the circuit description data model 165. Thus, the data model correlation helper 160 effectively maps correlation data to the circuit elements so that users are provided with more familiar information, e.g., information that is provided in terms of the underlying circuit elements for which the relationships stored in the correlation data store 180 are specified.

Though FIG. 1 has been described with reference to a design implementation process, it should be appreciated that the system also can be applied to manage correlation data for other processes. Any process in which an input is transformed into an output, and a record of that transformation is maintained, can be managed using the system 100 of FIG. 1, particularly where one or more intermediate files or versions of the input are created during the process.

Figure 2:
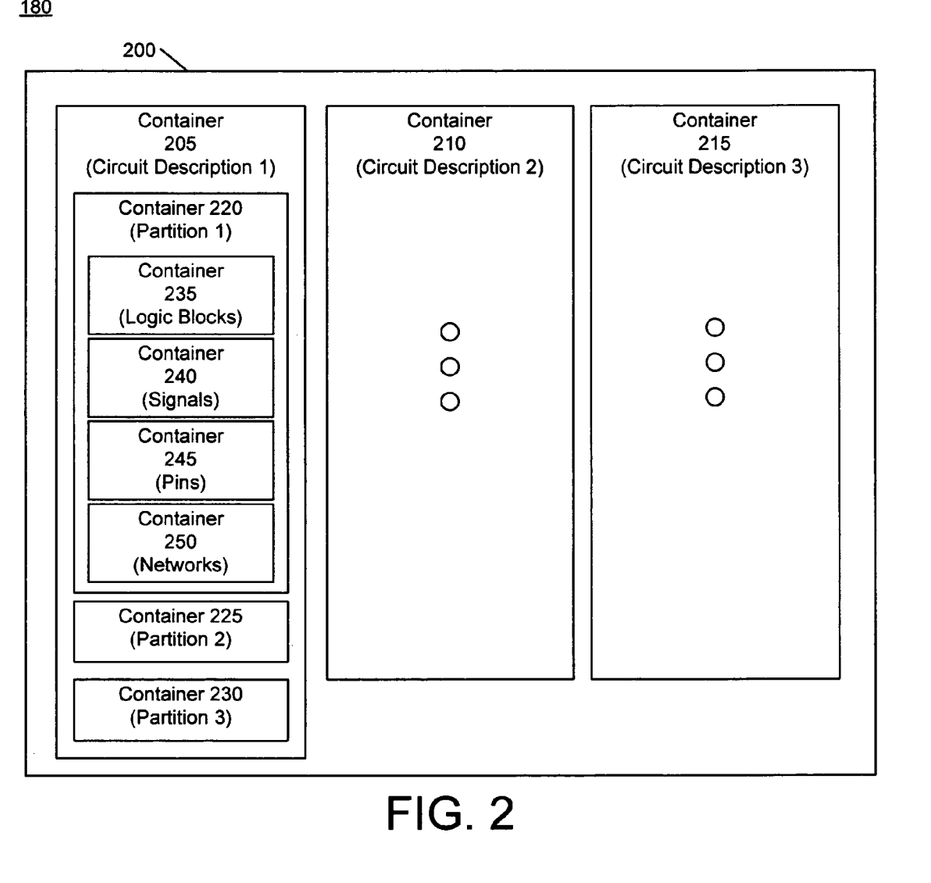
FIG. 2 is a block diagram illustrating a data storage system for use in managing correlation data in accordance with another embodiment of the present invention.

FIG. 2 is a block diagram illustrating a data storage system for use in managing correlation data, in accordance with another embodiment of the present invention. FIG. 2 illustrates an embodiment in which containers are arranged in a hierarchical fashion which depends upon circuit descriptions and circuit elements. The use of containers facilitates the hierarchical ordering of correlation data that can be used to specify relationships among various items of correlation information. By matching container hierarchy with circuit design hierarchy, more efficient look-ups and operations on the correlation data can be performed.

Each container 205, 210, and 215 can correspond to, or be used to store, correlation data generated for a particular circuit description. Such containers can be said to be circuit-level containers. Thus, the correlation data generated for each stage of the implementation process can be stored within a different container, with the top-level container 200 corresponding to the entire design implementation process.

A next level of the container hierarchy can include using one container for each partition of the circuit design. A partition refers to a user or tool-specified section of a circuit description that can be operated upon by the circuit design tools, at least in part, independently of the other partitions of the circuit design. Thus, container 205 can include containers 220, 225, and 230, each corresponding to a different partition of circuit description 1.

A next level of container hierarchy can utilize a container for each type of circuit element, e.g., one container for logic blocks, one for pins, one for signals, etc. As shown, container 220 corresponding to partition 1 of circuit description 1 can include container 235 including correlated items representing logic blocks, a container 240 including correlated items representing signals, a container 245 including correlated items representing pins, and a container 250 including correlated items representing networks.

As noted, this type of container hierarchy facilitates more efficient mapping between correlation items and circuit elements. Further, the container hierarchy improves the locality of the data for selected query types, e.g., a query relating to either pin correlation or block correlation. It should be appreciated that other containers also can be defined for various other circuit elements, such as flip-flops. As such, the examples presented with reference to FIG. 2 are not intended to limit the present invention.

Though the correlation data can include correlated item representations of circuit elements, there need not be a one-to-one relationship between actual circuit elements and the correlated items stored within the containers. Though not shown, containers 210 and 215 also can be organized similar to container 205. Additionally, each container at any level with the hierarchy of containers can include metadata that specifies application specific data. For example, the metadata of a container can indicate the location of that container within the hierarchy of containers. Other examples of metadata can indicate the types of correlated items stored within the container as well as any circuit description hierarchy information associated with the container, e.g., the container corresponds to a selected partition of the circuit description.

Figure 3:
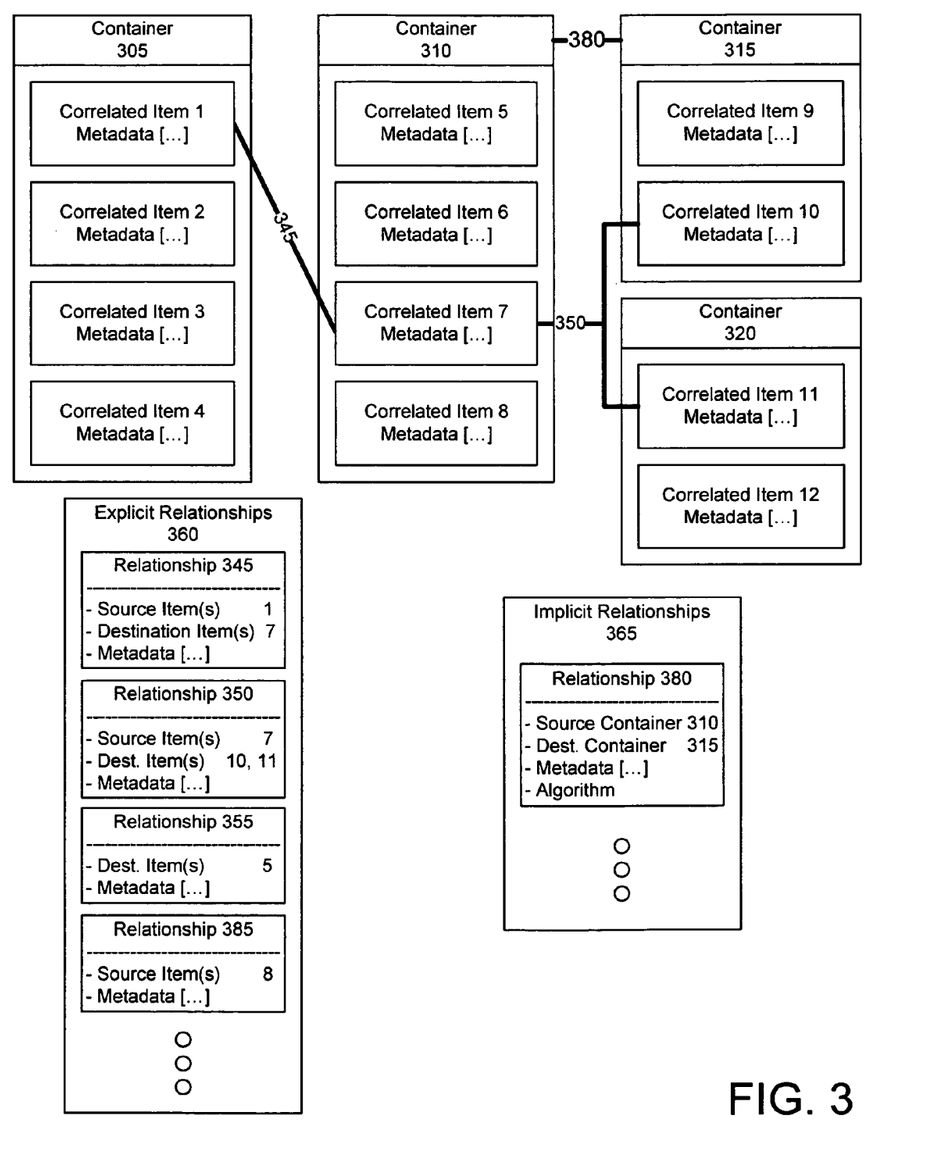
FIG. 3 is a block diagram illustrating a data storage system for use in managing correlation data in accordance with another embodiment of the present invention.

FIG. 3 is a block diagram illustrating a data storage system for use in managing correlation data in accordance with another embodiment of the present invention. For purposes of illustration, the container hierarchy has been abstracted away to more clearly demonstrate correlated items and the various relationships that can be defined within the correlation data. Accordingly, the correlation data store 180 is shown to include containers 305, 310, 315, and 320. No top-level container is illustrated in this example.

Each container can include zero or more correlated items, such as correlated items 1-12. In general, correlated items are representations of circuit elements and each is owned, or included within, a single container. As representations of circuit elements, the details of the circuit elements objects represented are not included within the correlated items. One or more parameters of the circuit element objects, however, may be specified by corresponding correlated items, e.g., a name of the represented circuit element. As noted, a one-to-one correspondence between correlated items and circuit elements as specified within the actual circuit descriptions need not exist.

Each of the correlated items can have zero or more outgoing and zero or more incoming relationships to be described in greater detail. In addition to incoming and outgoing relationships, each correlated item also can include metadata that can include, but is not limited to, application specific text, integers, unstructured binary data, etc. As previously noted, each container further can include other containers. New containers, for example, can be created through an interface in the owning container.

The explicit relationships 360 and implicit relationships 365 specify relationships among various correlated items. Though both varieties of relationships exist, circuit elements appear to be either correlated or not from the perspective of an end user as details indicating whether circuit elements are explicitly or implicitly related are masked.

Explicit relationships 360 can be specified as declarations. Such declarations can specify a relationship between zero or more source items (correlated items) and zero or more destination items (correlated items). An explicit relationship cannot have both zero source and zero destination items. In addition to the incoming and outgoing relationships, each correlated item can include metadata that can include, but is not limited to, application specific text, integers, unstructured binary data, etc.

The explicit relationships 360, unlike correlated items, are not associated with any single container. For purposes of illustration, selected explicit relationships also are shown graphically as links 345 and 350, which collectively define a bi-directional relation path of correlated items 1 and 7, which then branches to each of correlated items 10 and 11. The relation path can be traversed in either the forward or reverse direction. Each destination item of an explicit relationship can serve as a source for an outgoing relationship and each source item can serve as a destination for one or more incoming relationships. For example, in the pictured embodiment correlated item 1 is a source of explicit relationship 345 and correlated item 7 is the destination. Still, correlated item 7 is the source for explicit relationship 350 while correlated items 10 and 11 both are destinations.

Explicit relationship 350 illustrates that such relations need not progress in a linear fashion from one circuit description to the next, but rather link a variety of different containers and/or circuit descriptions. For example, it may be the case that containers 315 and 320 were generated from processing a circuit description corresponding to container 310. Explicit relationships can be defined among any of the containers. This structure allows more complex queries to be answered such as "what circuit elements in container 320 were generated from the same circuit elements that generated item 10 in container 315?" Thus, a relation path can be a tree-like structure having one or more branches, with each correlated item having 0, 1, or a plurality of source and/or destination items. Still, this illustration does not preclude the simplified case of a relation path which has no branches.

When an explicit relationship has no source items, the explicit relationship, which effectively begins a relation path, is referred to as a genesis relationship. Explicit relationship 355 is an example of a genesis relationship where correlated item 5 begins such a relation path. Further explicit relationships (not shown) can continue that path from correlated item 5, for example, to correlated item 9. When an explicit relationship has no destination items, the explicit relationship, which effectively ends a relation path, is referred to as an extinction relationship. Explicit relationship 385 is an example of an extinction relationship. Explicit relationship 385 indicates that correlated item 8 is the end of the relation path and is not transformed into any further circuit elements in subsequent circuit descriptions. Further explicit relationships (not shown) can specify that the path ending at correlated item 8, for example, came from correlated item 2. The container hierarchy discussed further aids the data model correlation helper in controlling the correlation manager despite not having any knowledge of the type of data stored or managed by the correlation manager.

To facilitate searching, in one embodiment, correlated items and explicit relationships 360 can be aware of one another. For example, a parameter of a correlated item can be used to specify an explicit relationship that references that correlated item. Additional parameters can be included such that a correlated item can specify each explicit relationship that applies to that correlated item. Each explicit relationship, as noted, specifies at least one of a source correlated item or a destination correlated item.

Relation paths can be modified by adding or deleting explicit relationships to the correlation data and further by adding or removing source items or destination items from the explicit relationships. Adding destination items causes a given relation path to branch to the designated correlated item. Removal of the last correlated item in a relation path causes a portion of the relation path to be deleted. Thus, for example, deletion of correlated items 10 and 11 would cause the relation path to be formed of only link 345 as link 350 would be deleted. Though not shown, explicit relationships can specify relationships within a same container as well as across two or more different containers of the correlation data store 180.

Implicit relationships 365, like explicit relationships, specify source items and destination items. Each implicit relationship also can specify a rule, e.g., an algorithm, that is evaluated to determine the relationships established by that implicit relationship. Implicit relationships 365, while not explicitly defined through the use of declarations, specify relationships between exactly two containers. More particularly, implicit relationships specify a single source container and a single destination container. While the source and destination containers can correspond to two different circuit descriptions, it may be the case that the source and destination container have a common parent container and, thus, are associated with a same circuit description.

Implicit relationships 365 have several characteristics that distinguish them from explicit relationships 360. One characteristic is that implicit relationships 365 can be used, or applied, selectively. An implicit relationship, for example, can be defined between two containers and can be applied only to selected correlated items within each container. For example, implicit relationship 380 has been defined between container 310 and container 315. A result obtained from evaluating the rule specified by implicit relationship 380 indicates which correlated items within containers 310 and 315 are related.

In one embodiment, conditional application of an implicit relationship can depend upon naming conventions of the circuit elements. In illustration, circuit elements having a name ending with "_a" can be considered to be implicitly related despite being located within two different containers and no explicit relationship indicating such a relationship. Thus, if several different logic gate circuit elements have a name ending in "_a" in one circuit description and are combined into a single Look-up Table (LUT) in a next circuit description, the resulting LUT may have a name also ending in "_a" thereby indicating an implicit relationship that is indicated within the correlation data and the correlation data store 180. For example, the logic gates ending in "_a" can be considered source items and the resulting LUT the destination item.

Another characteristic of implicit relationships 365 is that an order of relations can be applied. In the case where multiple implicit relationships 365 are defined between two containers, each implicit relationship can be associated with one or more different conditions that determine when that implicit relationship is to be applied or evaluated. This allows the evaluation of implicit relationships to be performed in a specified order until all implicit relationships whose conditions are met are evaluated.

Another characteristic of implicit relationships 365 is that an implicit relationship can be algorithmically defined rather than being explicitly defined. That is, an algorithm can be used to determine which correlated item(s) in a destination container are related to a given correlated item or set of correlated items within a source container. Similarly, an algorithm can be used to determine which correlated items in a source container are related given a correlated item or set of correlated items in a destination container. Implicit relationships 365 also can be defined to be unidirectional or bi-directional, whereas explicit relationships are bi-directional.

Yet another characteristic of implicit relationships 365 is that temporary correlated items can be created within a container to satisfy an implicit relationship. In general, when an implicit relationship is specified, one of several behaviors can be defined for that implicit relationship. One behavior is that only correlated items that were explicitly created and already exist within a container can be returned responsive to a correlation data query. Another behavior is that temporary correlated items can be returned.

Temporary correlated items are objects that can be dynamically created in response to a query and returned as a query result. In illustration, it may be the case that a user circuit description undergoes a limited amount of processing resulting in a second circuit description that only has been transformed slightly. Rather than creating a large amount of correlation data in the form of correlated items for unchanged circuit elements and a large number of explicit relationships linking the correlated items for the unchanged circuit elements from one circuit description to another, an implicit relationship can be created or defined by a design application within the correlation data. The implicit relationship can indicate that, in relevant part, unless it is explicitly stated otherwise, e.g., through one or more explicit relationships, particular circuit elements have not been changed. Implicit relationships such as these relieve users from having to specify a large number of explicit relationships that may or may not be useful at a later time.

The use of implicit relationships 365 can provide a significant savings in terms of RAM memory usage and disk usage. By creating temporary correlated items as needed, those correlated items need not be stored on disk. Further, such temporary correlated items need not be loaded into memory for processing. Explicit relationships also need not be stored for the temporary correlated items. In illustration, if a given circuit description includes 10,000 logic blocks represented by 10,000 correlated items, an implicit relationship, when executed, may cause the creation 10,000 temporary correlated items representing those 10,000 logic blocks in another container. When a query directed to the correlation data is executed, only those temporary correlated items from the 10,000 temporary correlated items, if any, that are relevant to the query are returned.

Figure 4:
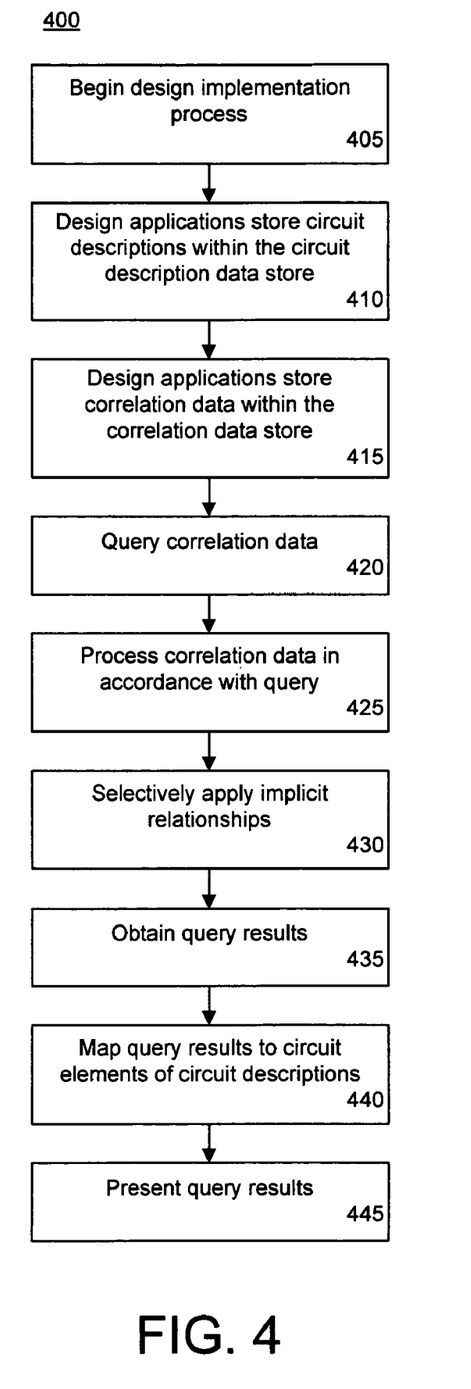
FIG. 4 is a flow chart illustrating a method of managing correlation data in accordance with another embodiment of the present invention.

FIG. 4 is a flow chart illustrating a method 400 of managing correlation data in accordance with another embodiment of the present invention. The illustrated method can be performed in the context of a design implementation process for translating a circuit design into a circuit description that can be used to program or otherwise configure a target device. Accordingly, in step 405, a design implementation process can begin. A user-specified circuit description can be provided to one or more design applications which successively transform the user-specified circuit description into a programmatic representation that can be used to program a target device, e.g., a bitstream. As noted, each design application can generate a circuit description and correlation data, which can be identified by, and/or provided to, the correlation management system.

In step 410, the design applications can store the circuit descriptions within a circuit description data store, for example, via the circuit description data model. In step 415, the design applications can store correlation data within the correlation data store, which is maintained independently of the circuit descriptions. As noted, the design applications can access the correlation data store via the correlation manager or the data model correlation helper. Though steps 410 and 415 are depicted as discrete steps, it should be appreciated that the circuit description data and the correlation data can be stored throughout the implementation process as such data is created and/or modified. Further, the correlation data for a given design implementation process can be augmented or modified at virtually any point in time. Software-based tools can operate on the circuit descriptions and generate further correlation data as well as metadata which can be used by still other software-based tools.

In step 420, the correlation data can be queried. A query can be initiated by a client software application through the correlation manager or the data model correlation helper. It should be appreciated that although the correlation data can be queried after completion of the implementation process by one or more client applications, the correlation data also can be queried or accessed during the implementation process by the design applications. In step 425, the correlation manager can start processing and/or searching the correlation data in accordance with the specified query. The correlation manager, in querying the correlation data, can begin identifying relevant correlated items, source items and destination items specified by explicit relationships, and traverse relation paths specified by the correlated item objects.

In step 430, implicit relationships can be selectively applied. As noted, each implicit relationship can be associated with one or more conditions that determine when that implicit relationship is to be applied. The conditions further can be used to determine the order in which implicit relationships are applied in the event that a plurality of implicit relationships are applicable. In one embodiment, when the correlation manager follows one, or more, relation paths to a termination point, a determination can be made as to whether any implicit relationships are applicable.

In illustration, when a relation path is followed and leads to a correlated item that does not lead or point to any other correlated items, that correlated item can be evaluated in accordance with implicit relationship conditions. Those implicit relationships that are applicable, per the conditions, can be applied in the order determined by the conditions. One example of a condition can include evaluating the name of a source item of the last correlated item in a relation path and selectively applying one or more implicit relationships such as creating temporary objects to be returned as a query result or with other query results.

In step 435, the results from the query can be obtained. The results can include zero or more source or destination items in answer to the query. In step 440, the query results can be mapped to the corresponding circuit elements of the circuit descriptions. This mapping can be performed by the data model correlation helper. In step 445, the query results, as mapped to the circuit descriptions, can be presented. That is, actual circuit elements or circuit element objects can be provided as a response to the query.

As noted, although the method 400 has been described with reference to a circuit design implementation process, it should be appreciated that the embodiments disclosed herein can be applied to any of a variety of computer-based processes in which correlation data is created and/or maintained.

The present invention can be realized in hardware, software, or a combination of hardware and software. The present invention can be realized in a centralized fashion in one computer system or in a distributed fashion where different elements are spread across several interconnected computer systems. Any kind of computer system or other apparatus adapted for carrying out the methods described herein is suited. A typical combination of hardware and software can be a general-purpose computer system with a computer program that, when being loaded and executed, controls the computer system such that it carries out the methods described herein. The present invention also can be embedded in a computer program product, which comprises all the features enabling the implementation of the methods described herein, and which when loaded in a computer system is able to carry out these methods.

The terms "computer program", "software", "application", variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an", as used herein, are defined as one or more than one. The term "plurality", as used herein, is defined as two or more than two. The term "another", as used herein, is defined as at least a second or more. The terms "including" and/or "having", as used herein, are defined as comprising, i.e., open language. The term "coupled", as used herein, is defined as connected, although not necessarily directly, and not necessarily mechanically, e.g., communicatively linked through a communication channel or pathway or another component or system.

This invention can be embodied in other forms without departing from the spirit or essential attributes thereof. Accordingly, reference should be made to the following claims, rather than to the foregoing specification, as indicating the scope of the invention.

What is claimed is:

1. A method of managing correlation data for a circuit design implementation process, comprising:
   identifying correlation data from each of a plurality of design applications, wherein each design application generates a circuit description and the correlation data specifies associations between circuit elements of different ones of the circuit descriptions;
   storing the circuit descriptions and the correlation data independently of one another; and
   determining a relationship among circuit elements of the circuit descriptions according to the correlation data,
   wherein storing further comprises storing correlation data for each circuit description within a different circuit-level container of a persistent correlation data store.

2. The method of claim 1, wherein storing further comprises, within each circuit-level container, creating a hierarchy of containers, wherein the hierarchy is determined according to a hierarchy of the circuit description corresponding to each respective circuit-level container.

3. The method of claim 1, further comprising defining at least one implicit relationship between two different containers of correlation information.

4. The method of claim 3, further comprising selectively imposing an implicit relationship between at least one correlated item in a first container and at least one correlated item in a second container.

5. The method of claim 3, wherein a plurality of implicit relationships are defined between two containers, the method further comprising determining an order in which the plurality of implicit relationships are selectively imposed upon the correlation data in the two containers.

6. The method of claim 3, further comprising:
   applying an implicit relationship in response to a query of the correlation data;
   creating at least one temporary correlated item within a container referenced by the implicit relationship; and
   returning the at least one temporary correlated item in response to the query.

7. The method of claim 1, wherein storing further comprises storing metadata relating to a transformation of a selected circuit element in one of the circuit descriptions into a circuit element of another circuit description.

8. The method of claim 1, wherein storing further comprises defining explicit relationships within the correlation data, wherein each explicit relationship specifies at least one of a source correlated item or a destination correlated item.

9. A system for managing correlation data generated during implementation of a circuit design for a programmable logic device, comprising:
   a circuit description data store comprising a plurality of circuit descriptions generated during a circuit design implementation process;
   a correlation data store comprising correlated items corresponding to selected circuit elements from the plurality of circuit descriptions and explicit relationships specifying relationships between correlated items, wherein the correlation data is not commingled with the circuit descriptions;
   a correlation manager configured to query the correlation data and identify relationships among correlated items; and
   a correlation helper configured to map correlated items to circuit elements from the circuit description data store,
   wherein the correlation data store is organized into a plurality of different circuit-level containers, wherein each circuit-level container comprises correlation data for a specific circuit description.

10. The system of claim 9, wherein each circuit-level container is organized into a hierarchy of containers, wherein the hierarchy is determined according to a hierarchy of the circuit description corresponding to each respective circuit-level container.

11. A system for managing correlation data generated during implementation of a circuit design for a programmable logic device, comprising:
   a circuit description data store comprising a plurality of circuit descriptions generated during a circuit design implementation process;
   a correlation data store comprising correlated items corresponding to selected circuit elements from the plurality of circuit descriptions and explicit relationships specifying relationships between correlated items, wherein the correlation data is not commingled with the circuit descriptions;
   a correlation manager configured to query the correlation data and identify relationships among correlated items; and
   a correlation helper configured to map correlated items to circuit elements from the circuit description data store, wherein the correlation manager selectively applies at least one implicit relationship between at least one correlated item in a first container and at least one correlated item in a second container.

12. An article of manufacture, comprising:

a non-transitory machine readable storage medium, having stored thereon a computer program having a plurality of code sections for managing correlation data for a circuit design implementation process, the medium comprising:

code for identifying correlation data from each of a plurality of design applications, wherein each design application generates a circuit description and the correlation data specifies associations between circuit elements of different ones of the circuit descriptions;

code for storing the circuit descriptions and the correlation data independently of one another; and code for determining a relationship among circuit elements of the circuit descriptions according to the correlation data, wherein the code for storing further comprises code for storing correlation data for each circuit description within a different container of a persistent correlation data store.

13. The article of manufacture of claim 12, further comprising code for defining at least one implicit relationship between two different containers of correlation information.

14. The article of manufacture of claim 13, further comprising:

code for selectively imposing an implicit relationship between at least one correlated item in a first container and at least one correlated item in a second container; and code for, wherein a plurality of implicit relationships are defined between two containers, determining an order in which the plurality of implicit relationships are selectively imposed upon the correlation data in the two containers.

15. The article of manufacture of claim 13, further comprising:

code for applying an implicit relationship in response to a query of the correlation data;

code for creating at least one temporary correlated item within a container referenced by the implicit relationship; and code for returning the at least one temporary correlated item in response to the query.

16. The article of manufacture of claim 12, wherein the code for storing further comprises code for storing metadata relating to a transformation of a selected circuit element in one of the circuit descriptions into a circuit element of another circuit description.

17. The article of manufacture of claim 12, wherein the code for storing further comprises code for defining explicit relationships within the correlation data, wherein each explicit relationship specifies at least one of a source correlated item or a destination correlated item.

* * * * *